United States Patent
Danilak et al.

(10) Patent No.: US 9,059,736 B2
(45) Date of Patent: Jun. 16, 2015

(54) METHODS, SOLID STATE DRIVE CONTROLLERS AND DATA STORAGE DEVICES HAVING A RUNTIME VARIABLE RAID PROTECTION SCHEME

(71) Applicants: Western Digital Technologies, Inc., Irvine, CA (US); Skyera, Inc., San Jose, CA (US)

(72) Inventors: Radoslav Danilak, Cupertino, CA (US); Rodney N. Mullendore, San Jose, CA (US); Justin Jones, Burlingame, CA (US); Andrew J. Tomlin, San Jose, CA (US)

(73) Assignees: Western Digital Technologies, Inc., Irvine, CA (US); Skyera, Inc., San Jose, CA (US)

( * ) Notice: Subject to any disclaimer, the term of this patent is extended or adjusted under 35 U.S.C. 154(b) by 42 days.

(21) Appl. No.: 13/756,328

(22) Filed: Jan. 31, 2013

(65) Prior Publication Data
US 2014/0157078 A1 Jun. 5, 2014

Related U.S. Application Data

(60) Provisional application No. 61/732,830, filed on Dec. 3, 2012.

(51) Int. Cl.
*H03M 13/00* (2006.01)
*H03M 13/09* (2006.01)
(Continued)

(52) U.S. Cl.
CPC ......... *H03M 13/09* (2013.01); *G06F 17/30218* (2013.01); *H03M 13/1102* (2013.01); *H03M 13/1515* (2013.01); *H03M 13/353* (2013.01); *G06F 11/1048* (2013.01)

(58) Field of Classification Search
CPC ................. G06F 11/1068; G06F 17/30218
USPC .................................. 714/779, 774
See application file for complete search history.

(56) References Cited

U.S. PATENT DOCUMENTS 5,621,660 A * 4/1997 Chaddha et al. ............. 709/247
5,768,535 A * 6/1998 Chaddha et al. ............. 709/247
(Continued)

FOREIGN PATENT DOCUMENTS

JP 2008102819 A 10/2006
KR 1020100076447 8/2011
(Continued)

OTHER PUBLICATIONS

International Search Report and Written Opinion dated Feb. 18, 2014 from PCT/US2013/068578, International Filing Date: Nov. 5, 2013, Applicant: Western Digital Technologies, Inc., 11 pages.
(Continued)

*Primary Examiner* — M. Mujtaba K Chaudry

(57) ABSTRACT

A data storage device may comprise a flash controller and an array of flash memory devices coupled to the flash controller. The array may comprise a plurality of S-Pages that may each comprise a plurality of F-Pages. In turn, each of the plurality of F-Pages may be configured to store a variable amount of data and a variable amount of error correction code. The flash controller may be configured to generate an error correction code across each F-Page of an S-Page and to store the generated error correction code within one or more F-Pages having the largest amount of data.

35 Claims, 8 Drawing Sheets

(51) Int. Cl.
  *G06F 11/10* (2006.01)
  *G06F 17/30* (2006.01)
  *H03M 13/11* (2006.01)
  *H03M 13/15* (2006.01)
  *H03M 13/35* (2006.01)

(56) References Cited

U.S. PATENT DOCUMENTS

| | | |
|---|---|---|
| 6,011,868 A * | 1/2000 | van den Branden et al. .. 382/233 |
| 6,289,471 B1 | 9/2001 | Gordon |
| 6,856,556 B1 | 2/2005 | Hajeck |
| 6,895,547 B2 | 5/2005 | Eleftheriou et al. |
| 6,934,904 B2 | 8/2005 | Talagala et al. |
| 7,072,417 B1 | 7/2006 | Burd et al. |
| 7,126,857 B2 | 10/2006 | Hajeck |
| 7,129,862 B1 * | 10/2006 | Shirdhonkar et al. ........ 341/67 |
| 7,149,846 B2 | 12/2006 | Hetrick |
| 7,263,651 B2 | 8/2007 | Xia et al. |
| 7,346,832 B2 | 3/2008 | Richardson et al. |
| 7,395,490 B2 | 7/2008 | Richardson et al. |
| 7,409,492 B2 | 8/2008 | Tanaka et al. |
| 7,430,136 B2 | 9/2008 | Merry, Jr. et al. |
| 7,447,807 B1 | 11/2008 | Merry et al. |
| 7,500,172 B2 | 3/2009 | Shen et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,657,816 B2 | 2/2010 | Cohen et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,739,576 B2 | 6/2010 | Radke |
| 7,765,373 B1 | 7/2010 | Merry et al. |
| 7,797,611 B2 | 9/2010 | Dholakia et al. |
| 7,809,994 B2 | 10/2010 | Gorobets |
| 7,814,393 B2 | 10/2010 | Kyung et al. |
| 7,898,855 B2 | 3/2011 | Merry, Jr. et al. |
| 7,912,991 B1 | 3/2011 | Merry et al. |
| 7,913,149 B2 | 3/2011 | Gribok et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,161,345 B2 | 4/2012 | Graef |
| 8,166,245 B2 | 4/2012 | Diggs et al. |
| 8,176,284 B2 | 5/2012 | Frost et al. |
| 8,176,360 B2 * | 5/2012 | Frost et al. ................ 714/6.24 |
| 8,179,292 B2 * | 5/2012 | Nakagawa ................... 341/59 |
| 8,181,089 B1 | 5/2012 | Fernandes et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,339,919 B1 | 12/2012 | Lee |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2003/0037298 A1 | 2/2003 | Eleftheriou et al. |
| 2004/0098659 A1 | 5/2004 | Bjerke et al. |
| 2005/0204253 A1 | 9/2005 | Sukhobok et al. |
| 2005/0216821 A1 | 9/2005 | Harada |
| 2005/0246617 A1 | 11/2005 | Kyung et al. |
| 2006/0036925 A1 | 2/2006 | Kyung et al. |
| 2006/0036933 A1 | 2/2006 | Blankenship et al. |
| 2006/0085593 A1 | 4/2006 | Lubbers et al. |
| 2007/0124648 A1 | 5/2007 | Dholakia et al. |
| 2008/0141054 A1 | 6/2008 | Danilak |
| 2008/0155160 A1 | 6/2008 | McDaniel |
| 2008/0168304 A1 | 7/2008 | Flynn et al. |
| 2008/0195900 A1 | 8/2008 | Chang et al. |
| 2008/0244353 A1 | 10/2008 | Dholakia et al. |
| 2008/0282128 A1 | 11/2008 | Lee et al. |
| 2008/0301521 A1 | 12/2008 | Gunnam et al. |
| 2008/0316819 A1 | 12/2008 | Lee |
| 2009/0070652 A1 | 3/2009 | Myung et al. |
| 2009/0193184 A1 | 7/2009 | Yu et al. |
| 2009/0240873 A1 | 9/2009 | Yu et al. |
| 2009/0241008 A1 | 9/2009 | Kim et al. |
| 2009/0241009 A1 | 9/2009 | Kong et al. |
| 2009/0249159 A1 | 10/2009 | Lee et al. |
| 2009/0259805 A1 | 10/2009 | Kilzer et al. |
| 2010/0017650 A1 | 1/2010 | Chin et al. |
| 2010/0020611 A1 | 1/2010 | Park |
| 2010/0049914 A1 | 2/2010 | Goodwin |
| 2010/0083071 A1 | 4/2010 | Shen et al. |
| 2010/0100788 A1 | 4/2010 | Yang et al. |
| 2010/0107030 A1 | 4/2010 | Graef |
| 2010/0125695 A1 | 5/2010 | Wu et al. |
| 2010/0131819 A1 | 5/2010 | Graef |
| 2010/0174849 A1 | 7/2010 | Walston et al. |
| 2010/0250793 A1 | 9/2010 | Syu |
| 2010/0262890 A1 | 10/2010 | Radke |
| 2010/0268985 A1 | 10/2010 | Larsen et al. |
| 2010/0275088 A1 | 10/2010 | Graef |
| 2010/0315874 A1 | 12/2010 | Ghodsi |
| 2011/0041039 A1 | 2/2011 | Harari et al. |
| 2011/0066793 A1 | 3/2011 | Burd |
| 2011/0087855 A1 | 4/2011 | Frost et al. |
| 2011/0099323 A1 | 4/2011 | Syu |
| 2011/0126078 A1 | 5/2011 | Ueng et al. |
| 2011/0179333 A1 | 7/2011 | Wesel et al. |
| 2011/0191649 A1 | 8/2011 | Lim et al. |

(56) References Cited

U.S. PATENT DOCUMENTS

| | | |
|---|---|---|
| 2011/0213919 A1 | 9/2011 | Frost et al. |
| 2011/0214037 A1 | 9/2011 | Okamura et al. |
| 2011/0231737 A1 | 9/2011 | Dachiku |
| 2011/0231739 A1 | 9/2011 | Kim |
| 2011/0239088 A1 | 9/2011 | Post |
| 2011/0246862 A1 | 10/2011 | Graef |
| 2011/0252294 A1 | 10/2011 | Ng et al. |
| 2011/0283049 A1 | 11/2011 | Kang et al. |
| 2011/0296273 A1 | 12/2011 | Rub |
| 2011/0302477 A1 | 12/2011 | Goss et al. |
| 2012/0072654 A1 | 3/2012 | Olbrich et al. |
| 2012/0079189 A1 | 3/2012 | Colgrove et al. |
| 2012/0084506 A1 | 4/2012 | Colgrove et al. |
| 2012/0084507 A1 | 4/2012 | Colgrove et al. |
| 2012/0260020 A1 | 10/2012 | Suryabudi et al. |
| 2012/0272000 A1 | 10/2012 | Shalvi |
| 2012/0278531 A1 | 11/2012 | Horn |
| 2012/0284460 A1 | 11/2012 | Guda |
| 2012/0324191 A1 | 12/2012 | Strange et al. |
| 2013/0054980 A1 | 2/2013 | Frost et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

FOREIGN PATENT DOCUMENTS

| | | |
|---|---|---|
| KR | 100929371 B1 | 11/2011 |
| WO | 2012058328 A1 | 5/2012 |
| WO | 2014065967 A1 | 5/2014 |
| WO | 2014084960 A1 | 6/2014 |
| WO | 2014088684 A1 | 6/2014 |

OTHER PUBLICATIONS

Shayan S. Garani, U.S. Appl. No. 13/417,057, filed Mar. 9, 2012, 30 pages.

Guangming Lu, et. al. U.S. Appl. No. 13/718,289, filed Dec. 18, 2012, 27 pages.

Guangming Lu, et. al. U.S. Appl. No. 13/742,243, filed Jan. 15, 2013, (This application Claims Priority from U.S. Appl. No. 61/738,764, filed Dec. 18, 2012), 22 pages.

Guangming Lu, et. al. U.S. Appl. No. 13/742,248, filed Jan. 15, 2013, (This application Claims Priority from U.S. Appl. No. 61/738,732, filed Dec. 18, 2012), 32 pages.

Shayan S. Garani, et. al., U.S. Appl. No. 13/725,965, filed Dec. 21, 2012, 31 pages.

\* cited by examiner

METHODS, SOLID STATE DRIVE CONTROLLERS AND DATA STORAGE DEVICES HAVING A RUNTIME VARIABLE RAID PROTECTION SCHEME

CROSS-REFERENCE TO RELATED APPLICATIONS

This application claims priority to provisional U.S. Patent Application Ser. No. 61/732,830, filed on Dec. 3, 2012, which is hereby incorporated by reference in its entirety.

BACKGROUND

In any die of a solid-state drive (SSD), there are likely to be a number of bad memory blocks, due to process technology and manufacturing variations, among other factors. Moreover, every block's endurance varies. In the early life of a die, most of the blocks are good. There are, however, some initial failures. During the bulk of the life of the die, random bit errors occur. Eventually, towards the end of life of the die, a wear effect manifests itself, in which the error rate increases. Every block goes through this lifecycle, albeit potentially at a different rate. Indeed, some blocks take a long time to go through this lifecycle, while others take a comparatively shorter period of time. To provide an adequate safety margin, however, conventional SSD systems are provisioned according to the worst-performing blocks.

Bits in a flash memory may be read incorrectly (i.e., develop bit errors) after being programmed. The charge level on a flash cell will change due to several conditions (e.g., time, temperature, accesses to other pages in the block, etc.). Eventually, when an affected cell is read, the wrong value is returned. Flash manufacturers specify a maximum number of bit errors for a flash page based on the process technology, cell design, lab testing, simulation, operating conditions, and the like. The bit error specification is usually specified as P errors per M bytes. In some cases, the controller manufacturer is responsible for implementing an Error Correcting Code (ECC), which satisfies or exceeds the specification. Types of ECC include Reed Solomon, BCH and Low-Density Parity-Check (LDPC) codes, which are methods of correcting bit errors in a block of data bits. The life (measured in Program/Erase (PE) cycles) of a flash device specified by a flash manufacturer is based on the implementation of the specified error correction requirements. Flash manufacturers provide extra bytes in a flash page to accommodate the number of expected ECC bits plus a small amount of space for other metadata such as, for example, Cyclic Redundancy Check (CRC) field, sector number, and the like.

The Open NAND flash Interface (ONFI) specification, version 2.3, defines a flash Page as containing a data area and a spare area. The spare area is intended for use in holding ECC checkbits and metadata, while the data area is assumed to contain sector (e.g. logical block) data. Errors can occur in data portions of specific pages and in entire pages. Different ECC codes and different error correction strategies are required for each type of error.

DETAILED DESCRIPTION

Figure 1A:
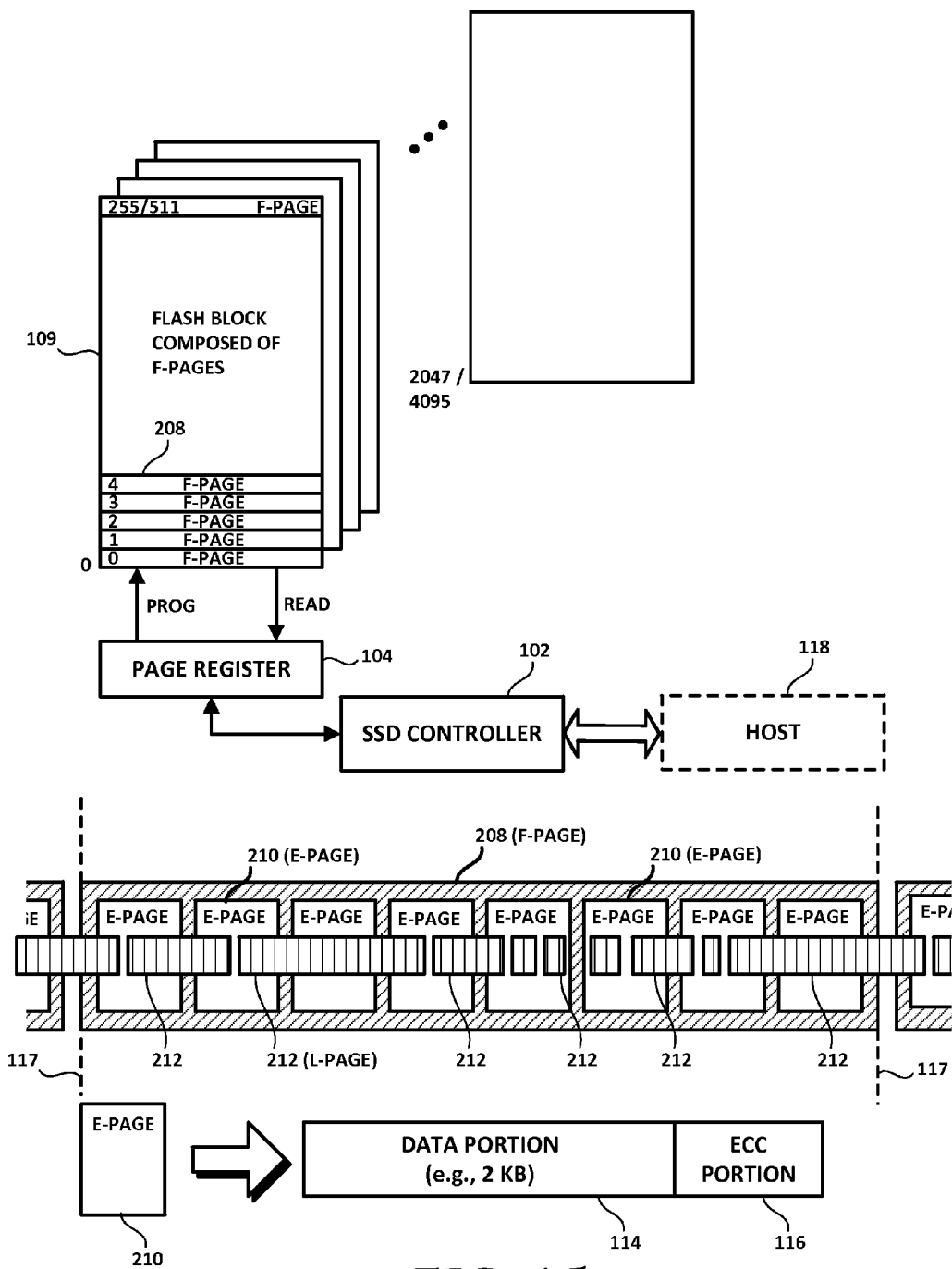
FIG. 1A is a diagram showing aspects of the physical and logical data organization of a data storage device according to one embodiment.

FIG. 1A is a diagram showing aspects of the physical and logical data organization of a data storage device according to one embodiment. In one embodiment, the data storage device is an SSD. In another embodiment, the data storage device is a hybrid drive including flash memory and rotating magnetic storage media. The disclosure is applicable to both SSD and hybrid implementations, but for the sake of simplicity, the various embodiments are described with reference to SSD-based implementations. An SSD controller 102 according to one embodiment may be configured to be coupled to a host, as shown at reference numeral 118. The host 118 may utilize a logical block addressing (LBA) scheme. While the LBA size is normally fixed, the host can vary the size of the LBA dynamically. For example, the LBA size may vary by interface and interface mode. Indeed, while 512 Bytes is most common, the 4 KB size is also gaining favor, as are the 512+ (520, 528, etc.) and 4K+ (4K+8, 4K+16, etc.) formats. As shown therein, the SSD controller 102 may comprise or be coupled to one or more page registers 104. The controller 102 may be configured to program and read data from an array of flash memory devices responsive to data access commands from host 118. While the description herein refers to flash memory, it is understood that the array of memory devices may comprise other types of non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof.

The page register 104 may be configured to enable the controller 102 to read data from and store data to the array.

The array of flash memory devices may comprise a plurality of flash memory devices in one or more die (e.g., 128 die). The flash memory devices may comprise a plurality of flash blocks, such as shown at 109 in FIG. 1A. A combination of flash blocks, grouped together, may be called a Superblock or S-Block. In some embodiments, the individual blocks that form an S-Block may be chosen from one or more dies, planes or other levels of granularity. An S-Block, therefore, may comprise a plurality of flash blocks, spread across one or more die, that are combined together. In this manner, the S-Block may form a unit on which the Flash Management System (FMS) operates. In some embodiments, the individual blocks that form an S-Block may be chosen according to a different granularity than at the die level, such as the case when the memory devices include dies that are sub-divided into structures such as planes (i.e., blocks may be taken from individual planes). According to one embodiment, allocation, erasure and garbage collection may be carried out at the S-Block level. In other embodiments, the FMS may perform data operations according to other logical groupings such as pages, blocks, planes, dies, etc.

Each of the flash blocks 109 may comprise a plurality of physical pages such as flash pages (F-Pages) 208. Each F-Page 208 may be of a fixed size such as, for example, 16 KB. The size of the F-Page 208, according to one embodiment, may be defined as the size of the minimum unit of program for a given flash device. As also shown in FIG. 1A, each F-Page 208 may be configured to accommodate one or more physical sub-pages, such as ECC pages, hereinafter denoted as E-Pages 210. As used herein, the term "E-Page" refers to a data structure configured to store data, in non-volatile memory, over which an error correcting code has been applied. According to one embodiment, the E-Page 210 may form the basis for physical addressing within the SSD and may constitute the minimum unit of flash read data transfer. That is, each E-Page 210 may be configured to store the minimum amount of data readable by the controller 102. The E-Page 210 may be of a predetermined fixed size (such as 2 KB, for example) and determine the size of the payload (e.g., host or other data) of the ECC system. The size of the physical pages (e.g., E-Pages), however, need not be fixed. In one embodiment, the address of an E-Page uniquely identifies the location of the E-Page within the flash memory. For example, the E-Page's address may specify the flash channel, a particular die within the identified flash channel, a particular block within the die, a particular F-Page and, finally, the start of the E-Page within the identified F-Page.

According to one embodiment, each F-Page 208 may be configured to fit one or more E-Pages 210 within its boundaries. For example, given 16 KB wide F-Pages 208 and a fixed size of 2 KB per E-Page 210, eight E-Pages 210 fit within a single F-Page 208, as shown in FIG. 1A. In any event, according to one embodiment, an integer number of E-Pages, such as a power of 2 multiple of E-Pages 210, including ECC, may be configured to fit into an F-Page 208. As also shown in FIG. 1A, each E-Page 210 may comprise a data portion 114 and, depending on where the E-Page 210 is located, may also comprise an ECC portion 116. The ECC portion 116 may be configured to store the ECC that was applied to the data stored in the data portion 114 of the E-Page 210. According to one embodiment, neither the data portion 114 nor the ECC portion 116 needs to be fixed in size. Therefore, according to one embodiment, for a given E-Page size, the ratio between the size of the ECC portion and the size of the data portion within an E-Page may be varied.

Figure 1B:
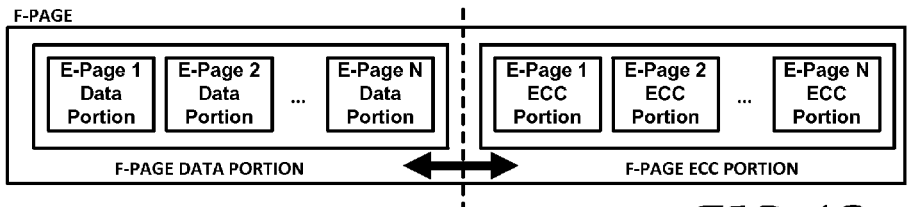
FIG. 1B is a diagram of an F-Page in which the data portion and ECC portion of each E-Page are physically separated, according to one embodiment.
Figure 1C:
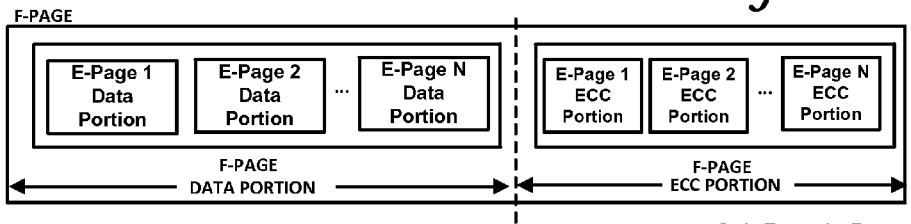
FIG. 1C is a diagram illustrating that the F-Page data portion and the F-Page ECC portion are variable in size within a given F-Page.

The E-Pages, data portions, and ECC portions need not be arranged according to the example arrangement of FIG. 1A. For example, the data portion and ECC portion of each E-Page may be physically separated, so that the data portions are grouped together and the ECC portions are grouped together within an F-Page, as shown in FIG. 1B. Within F-Pages, the data portions and the ECC portions may be variably-sized. Indeed, FIG. 1C shows an F-Page whose constituent data portions are relatively larger than the data portions of the E-Pages shown in FIG. 1B. Correspondingly, the ECC portions of the F-Page of FIG. 1C are relatively smaller in size than the ECC portions of the E-Pages shown in FIG. 1B. It follows, therefore, that in the aggregate within an F-Page, the F-Page data portion of the F-Page of FIG. 1C is larger than the F-Page data portion of the F-Page shown in FIG. 1B. Similarly, in the aggregate within an F-Page, the F-Page ECC portion of the F-Page of FIG. 1C is smaller in size, as compared to the F-Page data portion of the F-Page shown in FIG. 1B. That the data portions and ECC portions of F-Pages are variably-sized will be used to good advantage in the storage of F-Page error correcting codes, as is developed fully herein below. Other arrangements of E-Pages, data portions, and ECC portions are possible in various embodiments, and the size adjustment methods disclosed herein are applicable to those embodiments as well. In one embodiment, an F-Page may include just one E-Page.

Indeed, to bridge between physical addressing on the SSD and logical block addressing by the host, a logical page (L-Page) construct is introduced. An L-Page, denoted by the reference numeral 212 in FIGS. 1A and 2, may comprise the minimum unit of address translation used by the flash management system. Each L-Page 212, according to one embodiment, may be associated with an L-Page number. In one embodiment, data is logically stored in L-Pages 212 and L-Pages 212 are physically stored on the SSD in E-Pages 210. Whereas E-Pages 210 are, according to one embodiment, of a fixed size (an integer number of them may fit within an F-Page), the size of L-Pages 112, according to one embodiment, may be variable, due to variability in the compression of data to be stored. Since the compressibility of data varies, a 4 KB amount of data of one type may be compressed into a 2 KB L-Page while a 4 KB amount of data of a different type may be compressed into a 1 KB L-Page. Because of this compression, according to one embodiment, the physical and logical sizes need not be aligned, as is developed further herein. L-Pages 212 and their associated L-Page numbers, therefore, may be configured to enable the controller 102 to logically reference data (such as host data, for example) stored in one or more of the E-Pages 210. The L-Page 212 may also be utilized as the basic unit of compression. Indeed, unlike F-Pages 208 and E-Pages 210, L-Pages 212 are not, according to one embodiment, fixed in size and may vary with a range defined by a minimum compressed size of, for example, about 24 bytes to a maximum uncompressed size of, for example, about 4 KB or 4 KB+.

Figure 2:
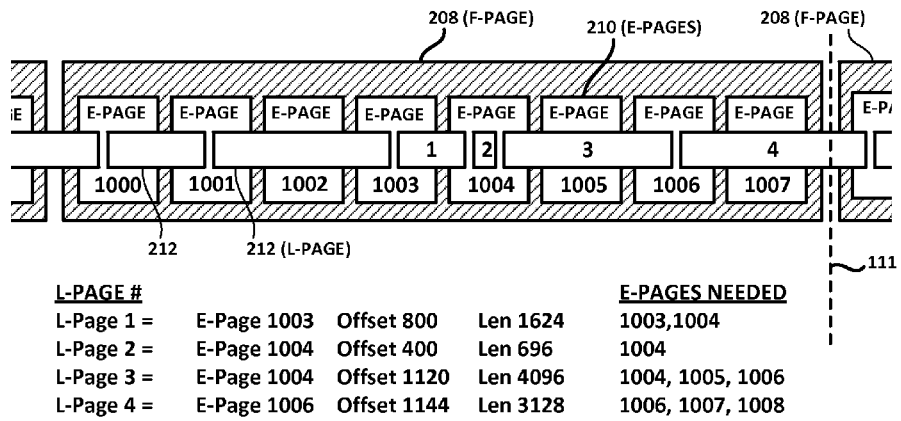
FIG. 2 shows a logical-to-physical address translation map and illustrative entries thereof, according to one embodiment.

As shown in FIGS. 1A and 2, L-Pages 212 need not be aligned with the boundaries of E-Page 210. Indeed, L-Pages 212 may be configured to have a starting address that is aligned with an F-Page 208 and/or E-Page 210 boundary, but also may be configured to be unaligned with either of the boundaries of an F-Page 208 or E-Page 210. That is, an L-Page starting address may be located at a non-zero offset from either the start or ending addresses of the F-Pages 208 or the start or ending addresses of the E-Pages 210, as shown in FIG. 1A. As the L-Pages 212 are not fixed in size and may be smaller than the fixed-size E-Pages 210, more than one L-Page 212 may fit within a single E-Page 210. Similarly, as the L-Pages 212 may be larger in size than the E-Pages 210, the L-Pages 212 may span more than one E-Page 210, and may even cross the boundaries of F-Pages 208, shown in FIG. 1A at numeral 117. As detailed further below, L-Pages 112 may also span block boundaries, such as would be the case wherein one of the boundaries 117 represented a block boundary.

Where the LBA size is 512 or 512+ bytes, a maximum of, for example, eight sequential LBAs may be packed into a 4 KB L-Page 212, given that an uncompressed L-Page 212 may be 4 KB to 4 KB+. It is to be noted that, according to one embodiment, the exact logical size of an L-Page 212 is unimportant as, after compression, the physical size may span from few bytes at minimum size to thousands of bytes at full size. For example, for 4 TB SSD device, 30 bits of addressing may be used to address each L-Page 112 to cover for an amount of L-Pages that could potentially be present in such a SSD.

FIG. 2 shows a logical-to-physical address translation map 250 and illustrative entries thereof, according to one embodiment. As stored data is referenced by the host in L-Pages 212 and as the SSD stores the L-Pages 212 in one or more E-Pages 210, a logical-to-physical address translation map is required to enable the controller 102 to associate an L-Page 212 to one or more E-Pages 210. Such a logical-to-physical address translation map (effectively, an L-Page to E-Page address translation map) is shown in FIG. 2 at 250 and, in one embodiment, is a linear array having one entry per L-Page 212. Such an address translation map 250 may be stored in a volatile memory, such as a DRAM.

FIG. 2 also shows entries in the address translation map 250 for four different L-Page numbers, which L-Page numbers are labeled in FIG. 2 as L-Page 1, L-Page 2, L-Page 3 and L-Page 4. According to one embodiment, each L-Page stored in the SSD may be pointed to by a single and unique L-Page number entry in the address translation map 250. Accordingly, in the example being developed herewith, four entries are shown. As shown, each entry in the map L-Page to E-Page translation 250 may comprise an L-Page number, which may comprise an identification of the E-Page containing the start address of the L-Page being referenced, the offset of the start address within the E-Page and the length of the L-Page. In addition, a plurality of ECC bits may provide error correction functionality for the map entry. For example, as shown in FIG. 2 and assuming an E-Page size of 2 KB, L-Page 1 may be referenced in the address translation map 250 as follows: E-Page 1003, offset 800, length 1,624, followed by a predetermined number of ECC bits (not shown). That is, in physical address terms, the start of the L-Page referenced by L-Page number L-Page 1 is within (not aligned with) E-Page 1003, and is located at an offset from the starting physical location of the E-Page 1003 that is equal to 800 bytes. The compressed L-Page associated with L-Page number L-Page 1, furthermore, extends 1,624 bytes, thereby crossing an E-Page boundary to E-Page 1004. Therefore, E-Pages 1003 and 1004 each store a portion of the L-Page associated with L-Page number L-Page 1.

Similarly, the compressed L-Page associated with L-Page number L-Page 2 is stored entirely within E-Page 1004, and begins at an offset therein of 400 bytes and extends only 696 bytes within E-Page 1004, thereby remaining entirely within the starting and ending address range designated as E-Page 1004. The compressed L-Page associated with L-Page number L-Page 3 starts within E-Page 1004 at an offset of 1,120 bytes (just 24 bytes away from the boundary of L-Page 2) and extends 4,096 bytes past E-Page 1005 and into E-Page 1006. Therefore, the L-Page associated with L-Page number L-Page 3 spans a portion of E-Page 1004, all of E-Page 1005 and a portion of E-Page 1006. Finally, the L-Page associated with L-Page number L-Page 4 begins within E-Page 1006 at an offset of 1,144 bytes, and extends 3,128 bytes to fully span E-Page 1007, to cross an F-Page boundary into E-Page 1008 of the next F-Page.

Collectively, each of these constituent identifier fields (E-Page, offset, length and ECC) making up each entry of the address translation map 250 may be, for example, 8 bytes in size. That is, for an exemplary 4 TB drive, the address of the E-Page may be 32 bits in size, the offset may be 12 bits (for E-Page data portions up to 4 KB) in size, the length may be 13 bits and the ECC field may be provided. Such an 8 byte entry may be created each time an L-Page is written or modified, to enable the controller 102 to keep track of the data (written in L-Pages) within the flash storage. As illustrated above, this 8-byte entry in the address translation map 250 may be termed a logical page number or LPN. It is to be noted that, in the case of a 4 KB sector size, the LBA is the same as the LPN. The LPN, therefore, may constitute the index of the L-Page within the logical-to-physical address translation table 250 and comprise the address of the entry within the non-volatile memory. Therefore, when the controller 102 receives a read command from the host 118, the LPN may be derived from the supplied LBA and used to index into the address translation map 250 to extract the location of the data to be read in the flash memory. When the controller 102 receives a write command from the host 118, the LPN may be constructed from the LBA and the address translation map 250 may be modified. For example, a new entry therein may be created. Depending upon the size of the volatile memory storing the address translation map 250, the LPN may be stored in a single entry or broken into, for example, two entries. For example, a first entry may identify the E-Page containing the starting address of the L-Page in question (plus ECC bits) and a second entry may identify the offset and length (plus ECC bits). Together, these two entries may correspond and point to a single L-Page within the flash memory. In other embodiments, the specific format of the address translation map entries may be different from the examples shown above.

Figure 3:
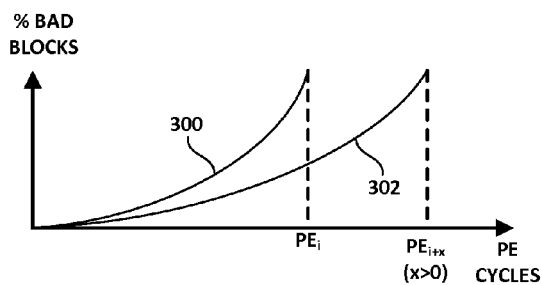
FIG. 3 shows a graph showing a percentage of bad blocks versus Program/Erase Cycles for both conventional devices and methods and according to one embodiment.
Figure 4:
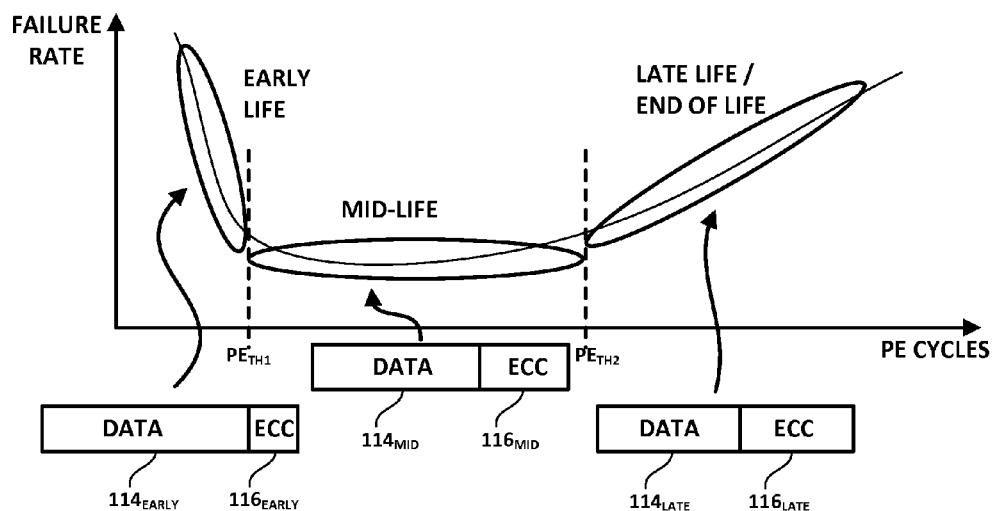
FIG. 4 is a diagram showing a relationship between block failure rates over the lifetime of a data storage device, and the manner in which the ECC and data portions of an E-Page may be varied to extend the useful lifetime of the data storage device, according to one embodiment.

The variable data portion sizes within the E-Pages are used in various ways to accommodate changing conditions of the memory blocks in the array of flash memory devices. The condition of the blocks is further discussed below with reference to FIGS. 3 and 4. FIG. 3 shows a graph showing a percentage of bad blocks versus PE cycles for both conventional devices and methods and those devices and methods according to various embodiments. FIG. 4 is a diagram showing a relationship between block failure rates over the lifetime of a data storage device such as a SSD, and the manner in which the ECC and data portions of an E-Page may be varied to extend the useful lifetime of the data storage device, according to one embodiment. The life cycle of blocks varies from block to block and die to die, with some blocks aging (becoming less able to reliably store data) quicker than other blocks. Such variations may be caused by process variations from die to die, the block location on the die and by use patterns and uneven PE cycles from one block to the next, among other reasons for uneven aging.

According to one embodiment, a data storage device may be configured to determine which of a plurality of ECC profiles to apply and/or to adjust the size of the ECC portion 116 and to correspondingly adjust a size of the data portion 114 of the E-Pages 210 in one or more F-Pages and/or one or more blocks, based at least in part on a condition of the block(s). The condition of the block may include, for example, a PE count of the block, an ECC error rate, flash error information, temperature, dwell time (time between erasure events), and internal flash state information, or most any other measurable physical characteristic such as operating conditions, temperature, age and the like. According to one embodiment, the controller may be configured to adjust the size of the ECC portion and/or the size of the data portion, based on host-provided metadata (generated as a result of host-specified data set management commands such as the TRIM command, for example) and/or overall free space in the data storage device. In doing so, one embodiment may operate to extend the useful life of the blocks from an initial PE count PE, as shown at 300 in FIG. 3 to a greater PE count of $PE_{i+x}$, where "x" is greater than zero, as shown at 302. This is because a block that has degraded can be protected with a greater amount of ECC, thus extending its useful life. In addition, the variability of ECC at a block/page level also means that the applied ECC can be tailored to the unique condition of the individual blocks/pages and can track the degradation paths experienced by those individual blocks/pages.

As suggested in FIG. 3, the useful life of the SSD extends to a PE count at which the percentage of bad blocks reaches a predetermined maximum. In practice, this predetermined maximum may be dictated by the SSD's ability to garbage collect. When garbage collection is no longer possible, because of an insufficient number of free blocks, the SSD has effectively reached the end of its useful life, or at least has reached the end of its ability to store new data. According to one embodiment, by judiciously adjusting the size of the ECC portion 116 and by correspondingly adjusting the size of the data portion 114 of the E-Pages 210 in one or more blocks, based at least in part on a condition of the block(s), the number of memory blocks deemed to be "bad blocks" may rise more slowly with respect to PE cycles, resulting in the life of the SSD being increased as measured by the number of PE cycles. It is to be noted that, according to one embodiment, the selected ECC profile for a block may be maintained until at least the block in question has been garbage collected.

As shown in FIG. 4, the percentage of bad blocks observed may be different for different points in the life cycle of the SSD. In early life (when the PE cycle count is low), the failure rate may be somewhat high; that is, there may be a comparatively higher incidence of page/block related failures. At least some of these early life page/block failures may be effectively uncorrectable using the ECC of the E-Pages. To address these ECC uncorrectable instances, some embodiments provide for an additional error correction mechanism in one or more F-Pages termed "Check Pages," which have check data calculated from data across multiple F-Pages, as will be further described in conjunction with FIGS. 8-10. Because of the use of Check Pages to address these early ECC-uncorrectable failures, in early life, E-Pages may be configured with comparatively weaker ECC than in later stages of life. A weaker ECC, moreover, may be provided in fewer bytes than would otherwise be necessary for a comparatively stronger ECC. Therefore, as shown, the ECC portion $116^{EARLY}$ may be adjusted to occupy a comparatively smaller number of bytes in the E-Page. In turn, this allows a correspondingly larger data portion $114_{EARLY}$, given the fixed size of the E-Pages. Advantageously, such larger data portions $114_{EARLY}$ frees up extra bytes, yields greater free space for data storage and garbage collecting and increases overprovisioning. Alternatively, to accommodate the higher incidence of failure rate, a higher amount of ECC may be used in some embodiments.

In mid-life, the SSD's ability to balance the size of the data portion and the strength of the ECC is at its peak, resulting in an efficient use of E-Pages to optimize lifespan. As shown, mid-life is a relatively stable period in the lifespan of the SSD, as shown by the relatively flat failure rate curve. Therefore, a somewhat greater number of bytes may be utilized for the ECC as shown at $116_{MID}$ as compared to $116_{EARLY}$. The space within an E-Page at mid-life reserved for the data portion $114_{MID}$ may then be, according to one embodiment, comparatively smaller than the space reserved for the data portion of an early life E-Page, as shown at $114_{EARLY}$. A comparatively smaller data portion $114_{MID}$, moreover, may only yield a relatively smaller amount of additional free space, and consequently, only result in a relatively small increase in overprovisioning. Yet, this comparatively smaller data portion $114_{MID}$ may nevertheless, be greater than would be the case if the block had been provisioned for worst case failure rate, as is conventionally done.

Toward late or end of life, the data portion $114_{LATE}$ may be adjusted smaller still, to make room within the E-Page for an even stronger (e.g., larger) ECC portion $116_{LATE}$. As one embodiment increases the useable life of the SSD through adjustments of the sizes of the data and ECC portions and selection of the ECC profile, the ECC strength, in late life/end of life, may need to be increased relative to the ECC portion size conventionally used. Through judicious selection of the ECC strength at the time of generating, therefore, the maximum PE count of the SSD may be increased over that conventionally possible in the case in which the sizes of both the data portion and the ECC portion of the E-Pages are static. This is because in early and mid-life, the space allocated to ECC is smaller than may be required according to conventional practice, in which the sizes of the ECC and data portions are static. According to one embodiment, even the increase in the ECC portion size and corresponding decrease in the data portion size in late/end of life is not sufficient to negate the gains achieved through the increased size of the data portion in early and mid-life, resulting in a net increase in the PE count over the useful lifetime of the data storage device. Moreover, according to one embodiment and as described below, leveraging the variably-sized data portions of F-Pages and the use of cross-F-Page error correction (also called "outer" error correction, as opposed to the ECC portions which are called "inner" error correction), the useful life of an SSD, as measured by the number of PE cycles, may be increased still further.

One embodiment supports and tracks block-level configuration of the ECC dynamically, over the life cycle of the SSD. Beyond adjusting the ECC over the lifecycle, different ECCs may be used for different blocks based on block quality. Weak blocks may be provided with additional ECC, whereas comparatively stronger blocks may be provided with a relatively weaker ECC in a relatively smaller ECC portion 116, thereby yielding additional free space and a consequent increase in overprovisioning.

According to one embodiment, the controller 102 may be configured to increase the size of the ECC portion and correspondingly decrease the size of the data portion of one or more of the E-Pages when the PE count reaches a first predetermined threshold $PE_{TH1}$, as the SSD transitions from early life to mid-life. Also according to one embodiment, the controller 102 may be configured to further increase the size of the ECC portion and again correspondingly decrease the size of the data portion of one or more of the E-Pages when the PE count reaches a second pre-determined threshold $PE_{TH2}$, as the SSD transitions from mid-life to late life/end of life. The second pre-determined threshold $PE_{TH2}$ may be higher than the first predetermined PE threshold $PE_{TH1}$. It is to be understood that the life stages (early, mid and late/end) described and shown herein are but exemplary stages and that a lesser or greater granularity (e.g., number) of life stages may be defined, with a correspondingly reduced or increased number of predetermined PE thresholds. Alternatively, the threshold governing the adjustments in the ECC portion and the data portions of the physical pages may be wholly independent of (or not solely dependent on) the PE count. Thus, embodiments are not to be limited to adjustments in the relative sizes of the data and ECC portions of physical pages based on a PE count. Indeed, other factors may drive or contribute such adjustments, such as the overprovisioning amount, free space, operating modes, operating temperatures, criticality of the data, safety margins and the like.

According to one embodiment, the choice of the strength (and the size) of the ECC portion may be made by a selection, by the controller 102, of one of a plurality of ECC profiles. According to one embodiment, such selection may be made at runtime. This selection may determine which of the plurality of ECC profiles to apply to one or more of the blocks, F-Pages or E-Pages. At least some of the ECC profiles may define different ECC strengths and, therefore, correspond to error correction codes that occupy a greater or lesser number of bytes and that are able to correct a greater or lesser amount of data (e.g., number of bits, symbols) stored in the physical pages. Given a fixed physical page size, the ECC profiles may dictate how many bytes are allocated to data in the data portion 114 and how many bytes are allocated to ECC in the ECC portion 116. Each profile may be associated with a different number. For example, 16 ECC profiles may be defined, which 16 ECC profiles, therefore, are addressable using 4 bits. The ECC profiles may be stored within or may be otherwise accessible to the controller 102 and may be selected based upon the condition of the E-Page(s), F-Page(s) or block(s) to be programmed.

According to one embodiment, the controller 102 may be further configured to determine which of the plurality of ECC profiles is to be applied across the E-Pages within the F-Pages of a block 109, at the time of generating the block 109. This, in turn, implies the ability for the controller 102 to apply different ones of the plurality of ECC profiles to different ones of the plurality of blocks 109, F-Pages 208 and/or E-Pages 210. For example, the controller 102 may be configured to select a first one of the plurality of ECC profiles to generate F-Pages 208 of a first block 109 and to select a second one of the plurality of ECC profiles to generate F-Pages 208 of a second block 109. In early and/or mid-life, the controller 102 may be configured to increase overprovisioning of the SSD by decreasing the size of the ECC portion 116 and correspondingly increasing the size of the data portion 114 of E-Pages 210 of a block 109 when, for example, the PE count of the block 109 is below a pre-determined or dynamically-selected or calculated threshold (e.g., $PE_{TH1}$ or $PE_{TH2}$).

According to one embodiment, the controller 102 may be further configured to determine which of the plurality of ECC profiles to apply to a block 109, F-Page 208 or E-Page 210 based on an error rate. When the error rate within a particular block 109, F-Page 208 or E-Page 210 is low, upon the next programming, the controller 102 may select an ECC profile defining a relatively smaller ECC portion 116 and a correspondingly greater data portion 114 for the particular E-Page 210, or E-Page(s) residing in the particular block 109 or F-Page 208. For example, the error rate may be based on a prior occurrence of ECC errors within a block 109, F-Page 208 or E-Page 210.

With reference back to FIG. 2, the L-Page associated with L-Page number L-Page 4 (L-Page 4) spans two F-Pages. Moreover, with continued reference to FIG. 2, dashed line 117 may indicate a block boundary, meaning that L-Page 4 spans two different blocks. According to one embodiment, the data portion of the E-Pages within a first F-Page may be corrected using the ECC according to a first ECC profile and the data portion of the E-Pages within a second F-Page may be corrected using the ECC according to a second ECC profile that is different than the first ECC profile. Therefore, it follows that the controller 102 may be further configured to read L-Pages, such as L-Page 4 of FIG. 2, that span across blocks (e.g., from a first block to a second block) and to accommodate two or more of the plurality of ECC profiles within a single read operation involving an L-Page. For example, the first F-Page may belong to a block that has transitioned into late life or end of life and whose E-Pages, therefore, comprise ECC portions 116 that may be of comparatively greater size than the ECC portions 116 of the E-Pages of the block to which the second F-Page belongs, which block may still be categorized as fitting within the mid-life stage, for example. Therefore, as the SSD is processing random host reads, there can be a plurality of different size ECC portions in the E-Pages present in the page register(s) 104.

According to one embodiment, any given block 109 may comprise a first E-Page having an ECC portion of a first size and a second E-Page having an ECC portion of a second size that is different from the first size. The second size, according to one embodiment, may be selected based on the location of the second E-Page within the block. In one embodiment, the different ECC portion sizes are selected based on the physical location, within a memory block of the F-Pages in which the first and second E-Pages reside. This F-Page location-based ECC profile selection may be useful in selecting the ECC profile to apply to particular F-Pages within a block. For example, the first F-Page of a block (such as F-Page 0 in FIG. 1A) and the last F-Page of a block (such as F-Page 255 in FIG. 1A) may be the worst F-Pages of the block, in terms of the occurrence of errors. Therefore, according to one embodiment, the ECC profile selected for the first and last F-Pages of a block may result in the controller 102 applying an ECC having a stronger error correcting capability to data stored in the physical pages (e.g., E-Pages) of the first and last F-Pages of a block. However, such location-influenced ECC profile selection is not limited to the first and last F-Pages of a block, but may be widely applied as needed to most efficiently extend the useful lifetime of the SSD and/or for any other purpose.

Figure 5:
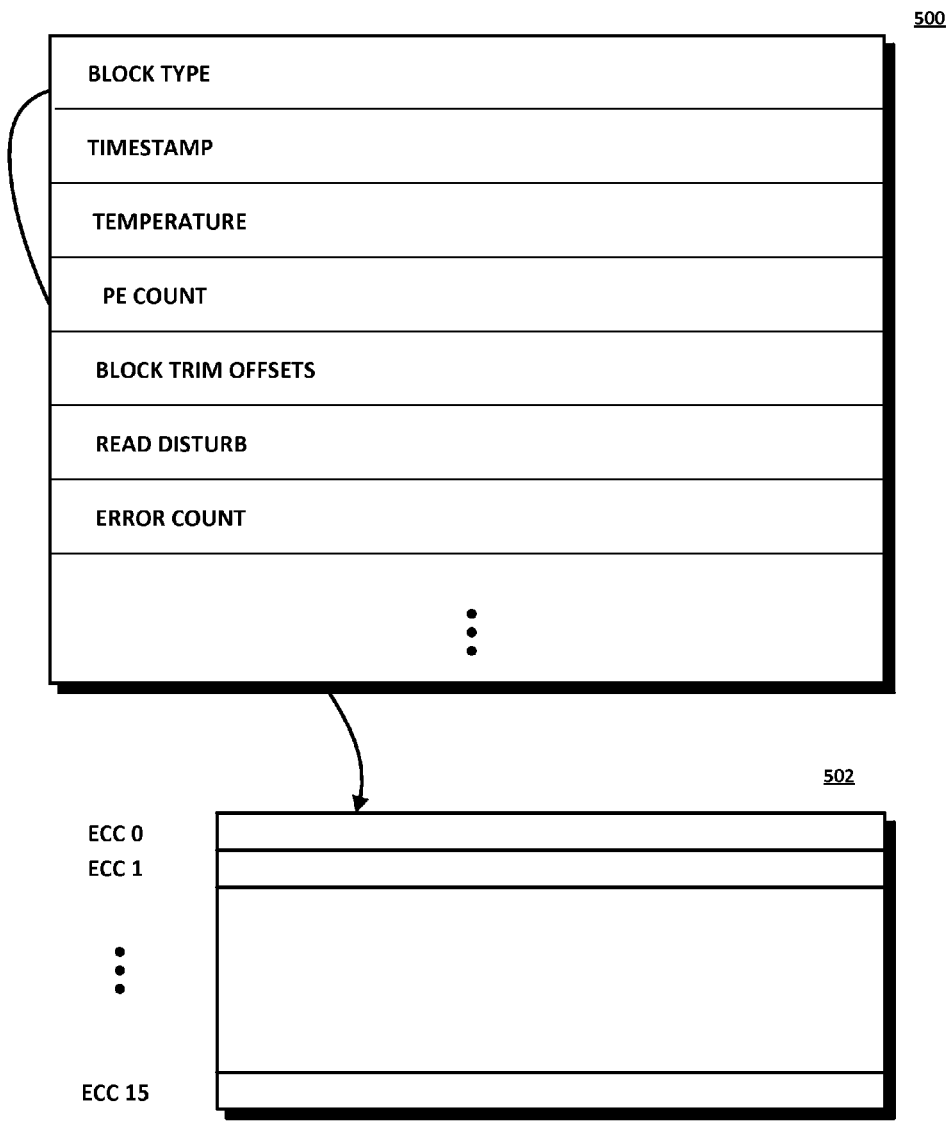
FIG. 5 is a diagram of a block information data structure, according to one embodiment.

FIG. 5 is a block diagram of a block information data structure, according to one embodiment. In one embodiment, every block 109 may be associated with, for example, about 32 bytes of information that may be stored, for example, in a block information data structure, as shown at 500 in FIG. 5. This or a similar block information data structure 500 may be saved by the controller firmware to the flash memory, so that the block information is stored in a non-volatile manner. As shown therein, the Block Type field may be configured to store which ECC profile has been applied to the data portions of the E-Pages of that particular block. Indeed, the ECC profile for each block should be tracked, as it is pulled out for every read, to enable the controller 102 to properly decode and error correct the data stored in the data portion of the E-Pages of that block. As shown, the Block Type field may occupy, for example, 4 bits to address a possible 16 ECC profiles. However, a greater or lesser number of ECC profiles may be provided, which may be selected using a greater or a lesser number of bits. The different ECC formats themselves may be stored in an ECC profile table, as shown at 502. The ECC profile table 502 may be referenced by the Block Type field of block information data structures 500.

It is to be noted that, should the strongest ECC format be ineffective in error-correcting data stored in the E-Pages of a given block, that block may be switched to lower page only (assuming MLC memory is used), meaning that instead of storing two bits per cell, only one bit per cell is stored. The Block Type field within the block information structure 500 may also indicate whether the block associated therewith is a fully bad block by storing, for example, a 0xFh value therein. Such a bad block is, in this manner, flagged as being thereafter unavailable for data storage, thereby potentially decreasing free space and overprovisioning. According to one embodiment, an ECC profile may be defined and selected to cause the controller 102 to skip an invalid F-Page during programming. This would be recognized by the controller 102, which would not program the invalid F-Page and would skip to the next sequential F-Page of the block.

The block information data structure 500, as shown in FIG. 5, may also comprise a Timestamp field, which may indicate the date and time of the last write. The block information data structure 500 may also include a Temperature field, to store temperature-related information, and a PE Count field to track the number of program/erase cycles undergone by the block, which field may be used, for example, when selecting the ECC profile to use and may, therefore, influence the selected size of the data portion 114 and the ECC portion 116 of the E-Pages of the block, as detailed earlier. One or more Block Trim Offset fields of the block information data structure 500, may be used by the SSD's firmware to adjust internal settings of the Flash device. The Block Trim Offset fields may be provided with their own error correction. Moreover, the block's TRIM information may be configured to contain data relative to the health of a block, such that if errors become uncorrectable using the current ECC, that information may be used to change the ECC profile and increase the strength of the ECC used to provide error correction for data stored in the E-Pages of that block. A Read Disturb field may be provided, to contain a number of times that this block has been read. An Error Count field may track the number of errors encountered in the block. As will be described later, data structure 500 may also include one or more data values (e.g., flag(s)) indicating which F-Page(s) within an S-Page is/are designated as the Check Page(s).

FIG. 5 provides an example format for storing information related to a block. In other embodiments, the information may be stored at a different level of granularity. For example, in some embodiments, each E-Page or F-Page may have its own profile designation and corresponding information. Also, the information may be stored in a format that is different from the example depicted in FIG. 5.

Figure 6:
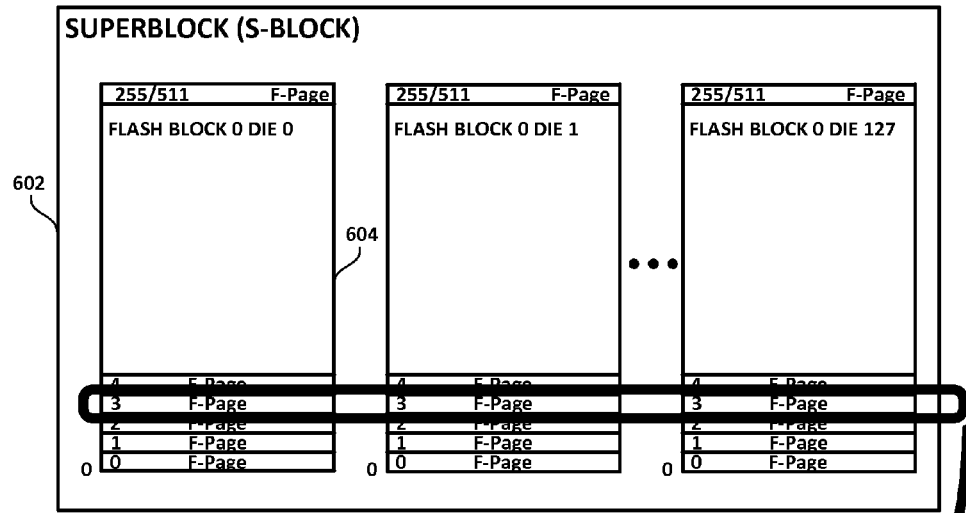
FIG. 6 is a block diagram of a superblock (S-Block), according to one embodiment.
Figure 7:
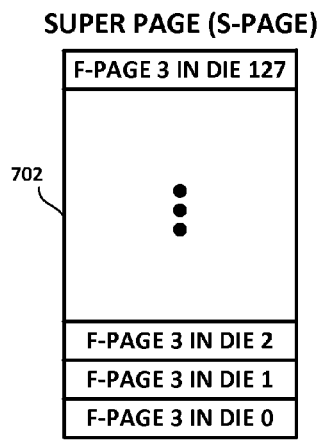
FIG. 7 shows another view of a super page (S-Page), according to one embodiment.

According to one embodiment, a structure known as an S-Journal may be configured to contain mapping information for a given S-Block. More precisely, according to one embodiment, S-Journals contain the mapping information for a predetermined range of E-Pages within a given S-Block. FIG. 6 is a block diagram of an S-Block, according to one embodiment. As shown therein, an S-Block 602 may comprise one flash block (F-Block) 604 (as also shown at 109 in FIG. 1) per die. An S-Block, therefore, may be thought of as a collection of F-Blocks, one F-Block per die, that are combined together to form a unit of the Flash Management System. According to one embodiment, allocation, erasure and GC may be managed at the S-Block level. Each F-Block 604, as shown in FIG. 6, may comprise a plurality of flash pages (F-Page) such as, for example, 256 or 512 F-Pages. An F-Page, according to one embodiment, may be the size of the minimum unit of program for a given non-volatile memory device. FIG. 7 shows a super page (S-page), according to one embodiment. As shown therein, an S-Page 702 may comprise one F-Page per F-Block of an S-Block, meaning that an S-Page spans across an entire S-Block.

Figure 8:
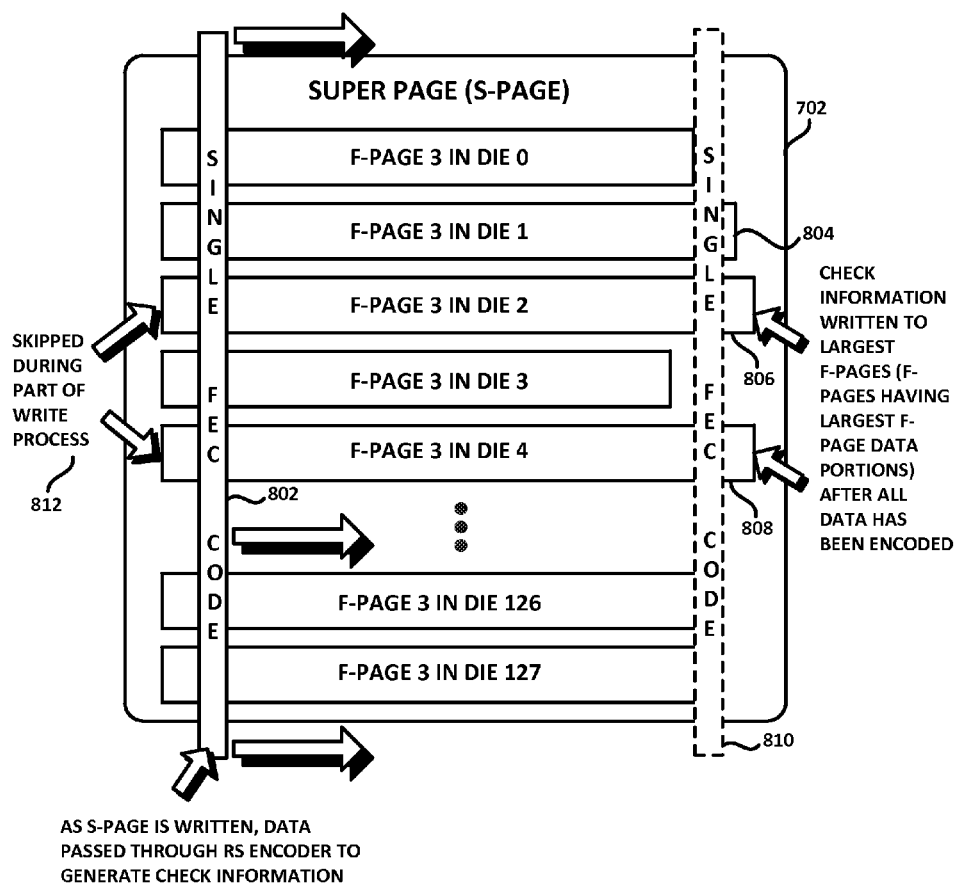
FIG. 8 is a diagram of an S-Page illustrating the generation and storage of Check Pages, according to one embodiment.

FIG. 8 is a diagram of an S-Page illustrating the generation and storage of Check Pages, according to one embodiment. An S-Page 702 is shown, comprising a correspondingly-numbered F-Page in each of a plurality of dies. In the example of FIG. 8, the S-Page 702 comprises the F-Page 3 of 128 dies. It is to be understood that S-Pages are not limited to the exemplary 128 dies shown in FIG. 8. The flash controller 102 may be configured to generate variably-sized ECC portions and to store data in corresponding variably-sized data portions within an F-Page, as shown and described relative to FIGS. 1B and 1C. Such ECC portions, therefore, may be characterized as being intra-E-Page error correction codes; namely, error correction codes that only apply to a predetermined data portion within a given E-Page within an F-Page. Such intra-E-Page error correction codes may also be characterized as "inner" error correction codes. As noted above, the variably-sized data portions of E-Pages within one F-Page collectively define, in the aggregate, an F-Page data portion.

According to one embodiment, the controller 102 may further be configured to generate one or more error correction codes across the F-Pages of an S-Page and to store the generated error correction code within that or those F-Pages of the S-Page that have the largest F-Page data portion. The one or more F-Pages used to store the generated error correction code are termed "Check Pages." Such cross-F-Page error correction codes may also be characterized as "outer" error correction codes, and operate in an orthogonal manner to the "inner" error codes to provide an additional layer of data protection. That is, the generated cross-F-Page error correction code(s) may be stored in the F-Page or F-Pages having the largest F-Page data portion(s), as such portions are shown in FIGS. 1B and 1C. FIG. 8 shows aspects of the generation and storage of such a cross-F-Page error correction code 802. According to one embodiment, the controller 102 may be configured to designate one or more F-Pages having the largest size F-Page data portion among the F-Pages in the S-Page as the Check Page(s); that is, as the F-Page(s) designated to store a cross-F-Page error correction code. According to one embodiment, the cross-F-Page error correction code may comprise a Forward Error Correction (FEC) code such as, for example, a Reed-Solomon ("R-S") code.

According to one embodiment, the controller 102 may be further configured to generate and store the E-Page error correction code at runtime, upon generating each E-Page. In contrast, the controller 102 may be configured to complete the generation and storage of the cross-F-Page error correction code (e.g., the R-S or other FEC code) after the data (e.g., user data) have been stored in the F-Pages within the S-Page. According to one embodiment and as suggested in FIG. 8, as the data (e.g., user data) within the S-Page are stored, a check information generator (e.g., a programmed controller or processor) may traverse the S-Page at runtime in a cross-F-Page (i.e., across several F-Pages simultaneously) manner and may generate one or more FEC (R-S, for example) codes 802 from the data portions of the constituent E-Pages of the F-Pages within the S-Page. To enable the code to be generated from all F-Pages, the F-Page(s) having the largest data portion(s) may be skipped when generating the S-Page as shown at 812, so as to enable the controller 102 to thereafter store the FEC code in such F-Page(s) having the largest data portion(s)—shown at references 806 and 808 in FIG. 8. As shown at 810, should the FEC code 802 be stored, for example, in F-Page 3 of die 127, the FEC code would not be generated from F-Page 3 in die 1, shown at reference 804. It is only by first encoding all data in the S-Page and by thereafter writing out the check (e.g., parity) symbols in designated F-Page(s) (the designated Check Page(s)) having the largest F-Page data portions that the cross-F-page error correction code is assured of covering all variably-sized F-Page data portions within an S-Page. As the Check Page(s) comprise the generated cross-F-Page error correction codes and not user data, they may be skipped (not read) during read operations. Check Pages, therefore, need only be accessed when attempting to recover from an error in an F-Page. As before, the ECC code stored within the ECC portion of an E-Page may be utilized to recover from an error within a data portion of a given E-Page. A failure of the ECC code stored within the ECC portion of an E-Page to correct a data error identifies that F-Page within the plurality of F-Pages of an S-Page that is subject to the error. It is against the thus-identified F-Page(s) that the cross-F-Page error correction code may be applied, in an attempt to recover from the F-Page error(s). It is to be noted that, when generating the FEC code 802, the E-Pages in F-Pages not having been designated as Check Pages may be padded (with, for example, zeros) such that the data field size of these E-Pages matches the size of the data field of the E-Pages in the Check Page(s). Conversely, when correcting F-Page(s), the pad values used during the generation of the FEC code 802 may be used during correction. Moreover, one or more of the F-Pages in an S-Page may have been previously marked as being "bad", or unavailable for data storage. Such bad F-Pages, it is understood, may be skipped during the generation of the FEC code 802 and may take no part in any subsequent correction(s) using such FEC code 802.

According to one embodiment, the controller 102 may be further configured to set a flag in a block information data structure (such as 500 in FIG. 5) to identify and designate a particular F-Page or F-Pages within an S-Page as being Check Page(s). Accordingly, the controller 102 may be configured to consult the block information data structure 500 to determine which of the F-Page(s) of an S-Page has or have been designated as Check Page(s). It follows, therefore, according to one embodiment, that the positions of the Check Page(s) are not fixed in S-Pages. For example, as between a first S-Page and a second S-Page, the F-Page(s) designated as Check Page(s) in the first S-Page may occupy a comparatively different position within the first S-Page as do the F-Page(s) designated as the Check Page(s) within the second S-Page.

It is to be noted that one or more additional F-Pages in the S-Page may be designated as Check Pages and configured to store a cross-F-Page error correction code. The decision to generate and store additional cross-F-Page error correction codes may depend on one or more factors. For example, additional cross-F-Page error correction codes may be generated and stored based on the configuration of the memory array, the performance of the memory array (e.g., tracked number of E-Page ECC errors, correctable or uncorrectable, and/or both) and/or the use-profile of predetermined portions of the memory array. Indeed, some combinations of configurations, performance and use-profiles may recommend designating a greater number of Check Pages than would otherwise be the case. For example, some areas of the memory array storing critical information may be provisioned with a comparatively greater number of Check Pages per S-Page than other areas of the memory array. For example, S-Pages storing file system information such as S-Journals may be provisioned with a comparatively greater number of Check Pages than S-Pages that do not store such file system information. Therefore, according to one embodiment, different S-Pages may comprise a different number of Check Pages and the positions of such Check Pages are not fixed across S-Pages.

According to one embodiment, the controller 102 may be configured to periodically determine (e.g., upon each Program-Erase (PE) cycle) the strength of E-Page error correction code to generate within the variably-sized ECC portion of each E-Page, the strength of the cross-F-Page error correction code to generate within the S-Page being generated and which F-Page(s) within the S-Page being generated that should be designated as the Check Page(s). Therefore, the strength of both the E-Page ECC, the cross-F-Page error correction code and the number of Check Pages may be dynamically determined and varied across, for example, S-Pages.

Figure 9:
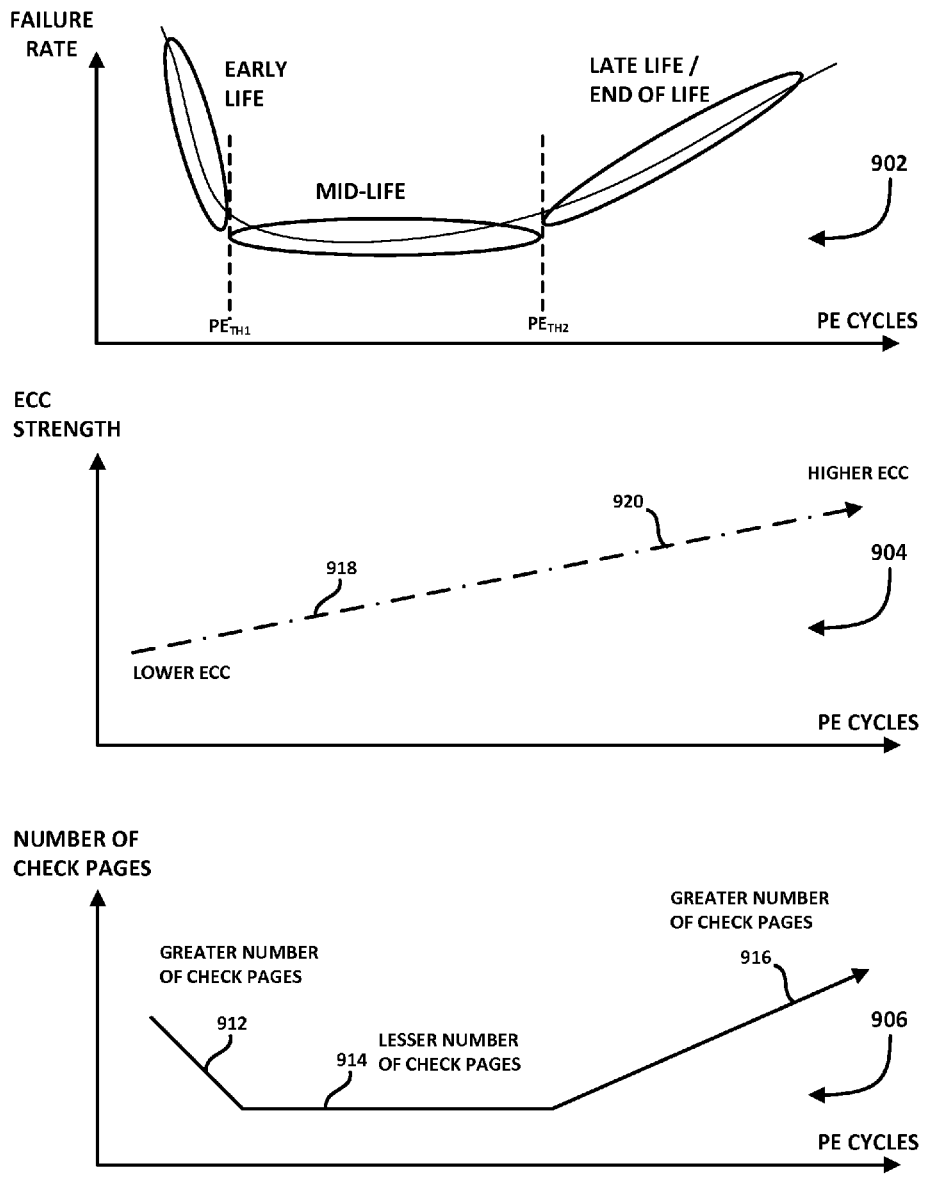
FIG. 9 is a diagram showing a relationship between block failure rates over the lifetime of a data storage device, and the manner in which the number of Check Pages may be varied to extend the useful lifetime of the data storage device, according to one embodiment.

FIG. 9 is a diagram showing a relationship between block failure rates over the lifetime of a data storage device, and the manner in which the number of Check Pages may be varied to extend the useful lifetime of the data storage device, according to one embodiment. The three graphs 902, 904, and 906 are correlated in the X-axis in that they plot three parameters versus the same PE count progression. Graph 902 plots the failure rate vs. the PE count, graph 904 plots the ECC strength used vs. the PE count, and graph 906 plots the number of Check Pages used vs. the PE count.

As described relative to FIG. 4, although the memory array may be relatively healthy, in early life the memory array may be characterized by a relatively high incidence of F-Page failures, which errors are not correctable using the ECC within the E-Pages of the F-Pages. Later in life, the strength of the ECC within the E-Pages may be gradually increased. To address the above-mentioned relative high incidence of page errors in the early life of the memory array, a comparatively greater number of Check Pages may be utilized in early life (as shown in 912), as compared with later in the life cycle of the array. For example, four Check Pages (or more) per S-Page may be used to correct such early-life F-Page errors that are otherwise uncorrectable using the ECC of the E-Pages. Later in life (e.g., during mid-life), as the strength of the ECC of E-Pages is increased (as shown in 918) and F-Page errors become less frequent, S-Pages may be provisioned with comparatively fewer Check Pages and their number may be kept relatively constant (as shown in 914). In late or end-of life during which E-Page errors rise and F-Page errors also become more frequent relative to mid-life, the strength of the ECC of E-Pages may be increased (as shown in 920) and the number of Check Pages per S-Page may be increased as needed (as shown in 916). According to one embodiment, the controller 102 may track E-Page ECC error rates and this tracked rate may be used as one exemplary factor in the determination of the number of Check Pages with which an S-Page may be provisioned. In another embodiment, the number of uncorrectable ECC errors is used as at least one factor in this determination. Other E-Page ECC and/or Check Page profiles may be applied, as those of skill in this art may recognize. For example, the relationship between the amount of ECC used and the Check Pages used in different life stages need not be correlated as shown in FIG. 9. In some embodiments, each could be independently adjusted without regard to the trend of the other.

Figure 10:
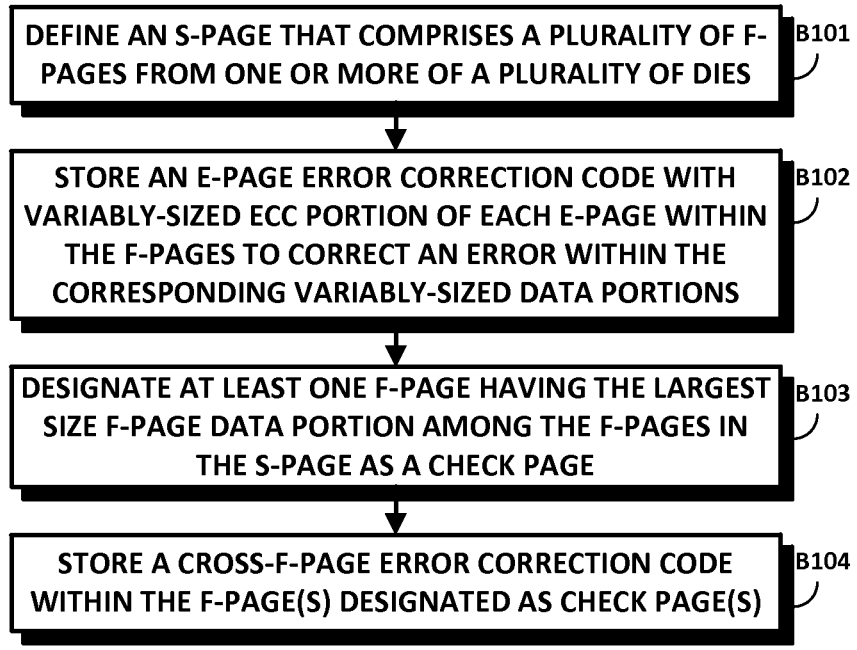
FIG. 10 is a flowchart of a method of generating and storing Check Pages in a data storage device, according to one embodiment.

FIG. 10 is a flowchart of a method of generating and storing Check Pages in a data storage device, according to one embodiment. As shown, Block B101 calls for defining an S-Page configured as shown and described above; namely, comprising a plurality of F-Pages from one or more of a plurality of dies. As shown at B102 and as shown at FIG. 1C, an E-Page error correction code with a variably-sized ECC portion may be stored within one or more of the E-Pages of the F-Pages of the defined S-Page, to correct an error within the corresponding variably-sized data portions of the E-pages. Block B103 calls for designating one or more F-Pages having the largest size F-page data portion among the F-pages in the defined S-page as a Check Page(s), as shown and described relative to FIG. 8. As shown at B104, a cross-F-Page error correction code may then be stored within each F-Page(s) designated as Check Pages. Such cross-F-Page error correction code may comprise, for example, an R-S code or other FEC code.

While certain embodiments of the disclosure have been described, these embodiments have been presented by way of example only, and are not intended to limit the scope of the disclosure. Indeed, the novel methods, devices and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. For example, those skilled in the art will appreciate that in various embodiments, the actual structures (such as, for example, the structure of the SSD blocks or the structure of the physical or logical pages) may differ from those shown in the figures. Depending on the embodiment, certain of the steps described in the example above may be removed, others may be added. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

The invention claimed is:

1. A solid state drive controller, comprising:
   a processor, the processor being configured to couple to an array of flash memory devices, the array comprising a plurality of dies, each die comprising a plurality of flash blocks (F-Blocks), each F-Block comprising a plurality of flash pages (F-Pages), at least some of the F-Page comprising at least one error correcting code page (E-Page), and at least some of the E-Pages comprising a variably-sized error correction code (ECC) portion and a corresponding variably-sized data portion, the variably-sized data portions within one F-Page defining, in the aggregate, an F-Page data portion,
   wherein the processor is configured to:
      define an S-Page that comprises a plurality of F-Pages from one or more of the plurality of dies;
      within the S-Page,
         store an E-Page error correction code within the variably-sized ECC portion of each E-Page within the F-Pages to correct an error within the corresponding variably-sized data portion;
         designate at least one F-Page having a largest size F-Page data portion among the F-Pages in the S-Page as a Check Page; and
         store a cross-F-Page error correction code within the at least one Check Page.

2. The solid state drive controller of claim 1, wherein the cross-F-Page error correction code comprises a Forward Error Correction (FEC) code.

3. The solid state drive controller of claim 2, wherein the FEC code comprises a Reed-Solomon code.

4. The solid state drive controller of claim 1, wherein the E-Page error correction code comprises a Low-Density Parity-Check (LDPC) error correction code.

5. The solid state drive controller of claim 1, wherein the processor is configured to generate and store the E-Page error correction code at runtime, at a time of generating one of the plurality of E-Pages.

6. The solid state drive controller of claim 1, wherein the processor is further configured to generate the cross-F-Page error correction code for the S-Page as data is written to the S-Page.

7. The solid state drive controller of claim 1, wherein the processor is further configured to read data from the S-Page and to skip the at least one F-Page within the S-Page that has been designated as a Check Page.

8. The solid state drive controller of claim 1, wherein the processor is further configured to:
   set a flag in a block information data structure to designate particular F-Pages within an S-Page as being Check Pages; and
   consult the block information data structure to determine which of the F-Pages of an S-Page have been designated as Check Pages.

9. The solid state drive controller of claim 1, wherein the processor is further configured to designate additional F-Pages in the S-Page as Check Pages, depending upon at least one of: (1) a configuration of the array, (2) a performance of the array and (3) a use-profile of predetermined portions of the array.

10. The solid state drive controller of claim 1, wherein the processor is further configured to designate additional F-Pages as Check Pages in S-Pages storing a predetermined type of information.

11. The solid state drive controller of claim 10, wherein the predetermined type of information comprises metadata.

12. The solid state drive controller of claim 10, wherein the predetermined type of information comprises host-indicated data.

13. The solid state drive controller of claim 1, wherein as between a first S-Page and a second S-Page, the at least one F-Page designated as a Check Page in the first S-Page occupies a comparatively different position within the first S-Page as does the at least one F-Page designated as a Check Page within the second S-Page.

14. The solid state drive controller of claim 1, wherein the S-Page is a first S-Page and the controller is further configured to define a second S-Page that has a greater number of F-Pages designated as Check Pages than the first S-Page.

15. The solid state drive controller of claim 1, wherein the processor is further configured to, when writing to an F-Block, determine at least one of:
   (1) a strength of E-Page error correction code to generate within the variably-sized ECC portion of each E-Page;
   (2) a strength of cross-F-Page error correction code to generate; and
   (3) which F-Pages within an S-Page to designate as a Check Page.

16. The solid state drive controller of claim 1, wherein the processor is further configured to apply the cross-F-Page error correction code when the E-Page error correction code fails to correct an encountered error.

17. A data storage device, comprising:
   the controller of claim 1, and
   the array of flash memory devices.

18. A method of controlling a data storage device, the data storage device comprising a processor, the processor being configured to couple to an array of flash memory devices, the array comprising a plurality of dies, each die comprising a plurality of flash blocks (F-Blocks), each F-Block comprising a plurality of flash pages (F-Pages), at least some of the F-Page comprising at least one error correcting code page (E-Page), and at least some of the E-Pages comprising a variably-sized error correction code (ECC) portion and a corresponding variably-sized data portion, the variably-sized data portions within one F-Page defining, in the aggregate, an F-Page data portion, the method comprising:

defining an S-Page that comprises a plurality of F-Pages from one or more of the plurality of dies;
    within the S-Page,
        storing an E-Page error correction code within the variably-sized ECC portion of each E-Page within the F-Pages to correct an error within the corresponding variably-sized data portion;
        designating at least one F-Page having a largest size F-Page data portion among the F-Pages in the S-Page as a Check Page; and
        storing a cross-F-Page error correction code within the at least one Check Page.

19. The method of claim 18, wherein the cross-F-Page error correction code comprises a Forward Error Correction (FEC) code.

20. The method of claim 19, wherein the FEC code comprises a Reed-Solomon code.

21. The method of claim 18, wherein the E-Page error correction code comprises a Low-Density Parity-Check (LDPC) error correction code.

22. The method of claim 18, wherein storing the E-Page error correction code comprises generating and storing the E-Page error correction code at runtime, at a time of generating one of the plurality of E-Pages.

23. The method of claim 18, wherein storing the cross-F-Page error correction code comprises generating and storing the cross-F-Page error correction code for the S-Page as data is written to the S-Page.

24. The method of claim 18, further comprising reading data from the S-Page and skipping the at least one F-Page within the S-Page having been designated as a Check Page.

25. The method of claim 18, further comprising:
    setting a flag in a block information data structure to designate particular F-Pages within an S-Page as being Check Pages; and
    consulting the block information data structure to determine which of the F-Pages of an S-Page have been designated as Check Pages.

26. The method of claim 18, further comprising designating additional F-Pages in the S-Page as Check Pages, depending upon at least one of: (1) a configuration of the array, (2) a performance of the array and (3) a use-profile of predetermined portions of the array.

27. The method of claim 18, further comprising designating additional F-Pages as Check Pages in S-Pages storing a predetermined type of information.

28. The method of claim 27, wherein the predetermined type of information comprises one of metadata and host-indicated data.

29. The method of claim 18, wherein as between a first S-Page and a second S-Page, the at least one F-Page designated as a Check Page in the first S-Page occupies a comparatively different position within the first S-Page as does the at least one F-Page designated as a Check Page within the second S-Page.

30. The method of claim 18, wherein the S-Page is a first S-Page and wherein the method further comprises defining a second S-Page that has a greater number of F-Pages designated as Check Pages than the first S-Page.

31. The method of claim 18 wherein, when writing to an F-Block, the method further comprises determining at least one of:
    (1) a strength of E-Page error correction code to generate within the variably-sized ECC portion of each E-Page;
    (2) a strength of cross-F-Page error correction code to generate; and
    (3) which F-Pages within an S-Page to designate as a Check Page.

32. The method of claim 18, further comprising applying the cross-F-Page error correction code when the E-Page error correction code fails to correct an encountered error.

33. A method of controlling a data storage device, the data storage device comprising a flash controller and an array of flash memory devices coupled to the flash controller, the array comprising a plurality of S-Pages that each comprise a plurality of F-Pages, the method comprising:
    storing, in each of the plurality of F-Pages, a variable amount of data and a variable amount of error correction code;
    generating an error correction code across each F-Page of an S-Page; and
    storing the generated error correction code within at least one F-Page having a largest amount of data.

34. A solid state drive controller, comprising:
    a processor, the processor being configured to couple to an array of flash memory devices comprising a plurality of S-Pages that each comprise a plurality of F-Pages, each of the plurality of F-Pages being configured to store a variable amount of data and a variable amount of error correction code;
    wherein the processor is configured to generate an error correction code across each F-Page of an S-Page and to store the generated error correction code within at least one F-Page comprising a largest amount of data.

35. A data storage device, comprising:
the controller of claim 34, and
the array of flash memory devices.

* * * * *